(12) United States Patent
Yasui

(10) Patent No.: US 9,659,745 B2
(45) Date of Patent: May 23, 2017

(54) CHARGED PARTICLE BEAM DRAWING APPARATUS, INFORMATION PROCESSING APPARATUS AND PATTERN INSPECTION APPARATUS

(71) Applicant: NuFlare Technology, Inc., Yokohama (JP)

(72) Inventor: Kenichi Yasui, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/619,281

(22) Filed: Feb. 11, 2015

(65) Prior Publication Data

US 2015/0279617 A1 Oct. 1, 2015

(30) Foreign Application Priority Data

Mar. 26, 2014 (JP) .................................. 2014-063639

(51) Int. Cl.
*H01J 37/30* (2006.01)
*H01J 37/317* (2006.01)

(52) U.S. Cl.
CPC ...... *H01J 37/3005* (2013.01); *H01J 37/3174* (2013.01); *H01J 2237/3175* (2013.01)

(58) Field of Classification Search
CPC .. H01J 37/3005; H01J 37/302; H01J 37/3023; H01J 37/3026; H01J 37/3174; H01J 37/3175; H01J 37/3177; G06F 19/00; G06F 17/50; G06F 17/5072; G06F 17/5081
See application file for complete search history.

(56) References Cited

U.S. PATENT DOCUMENTS

| 6,035,113 A * | 3/2000 | Gerber | H01J 37/3023 |
| | | | 716/53 |
| 2008/0067441 A1* | 3/2008 | Wake | B82Y 10/00 |
| | | | 250/492.21 |
| 2009/0187878 A1* | 7/2009 | Ogino | B82Y 10/00 |
| | | | 716/55 |

(Continued)

FOREIGN PATENT DOCUMENTS

| JP | 2002-184680 | 6/2002 |
| JP | 3545190 | 7/2004 |

(Continued)

OTHER PUBLICATIONS

Office Action issued Feb. 5, 2016 in Korean Patent Application No. 10-2015-0039945 (with English language translation).

(Continued)

*Primary Examiner* — David E Smith
(74) *Attorney, Agent, or Firm* — Oblon, McClelland, Maier & Neustadt, L.L.P.

(57) ABSTRACT

A charged particle beam drawing apparatus of an embodiment includes: a graphic information file for storing graphic information for each of elements (for example, patterns) at a level underlying an element (for example, a cell) at a particular level in hierarchically-structured drawing data which has elements at each level; and an attribute information file for storing attribute information to be given to each of the elements at the underlying level in association with information (for example, an index number) on the element at the particular level.

20 Claims, 5 Drawing Sheets

(56) References Cited

U.S. PATENT DOCUMENTS

| | | | | |
|---|---|---|---|---|
| 2009/0307640 | A1* | 12/2009 | Chapman | G06F 17/5045 716/136 |
| 2011/0121208 | A1* | 5/2011 | Nakayamada | B82Y 10/00 250/492.22 |
| 2012/0085940 | A1* | 4/2012 | Matsumoto | B82Y 10/00 250/492.3 |
| 2012/0211674 | A1* | 8/2012 | Kato | G03F 1/78 250/492.3 |

FOREIGN PATENT DOCUMENTS

| | | |
|---|---|---|
| JP | 2009-206248 | 9/2009 |
| KR | 10-2009-0092715 A | 9/2009 |

OTHER PUBLICATIONS

Office Action issued Aug. 26, 2016 in Korean Patent Application No. 10-2015-0039945 (with English language translation).
Office Action issued Mar. 31, 2017, in Japanese Patent Application No. 2014-063639, filed Mar. 26, 2014, (w/English-language Translation).

* cited by examiner

CHARGED PARTICLE BEAM DRAWING APPARATUS, INFORMATION PROCESSING APPARATUS AND PATTERN INSPECTION APPARATUS

CROSS-REFERENCE TO THE RELATED APPLICATION

This application is based on and claims the benefit of priority from Japanese Patent Application No. 2014-063639, filed on Mar. 26, 2014; the entire contents of which are incorporated herein by reference.

FIELD

Embodiments described herein relate generally to a charged particle beam drawing apparatus, an information processing apparatus and a pattern inspection apparatus.

BACKGROUND

Along with recent advancement toward higher integration and lager capacity of large-scale integrated circuits (LSIs), the circuit line width required for semiconductor devices has become increasingly smaller. The photolithographic technique is used to form desired circuit patterns in semiconductor devices. In this photolithographic technique, pattern transfer is performed using a defined pattern called a photomask (a reticle). A charged particle beam drawing apparatus having fine resolution is used to produce highly accurate photomasks to be used for such pattern transfer.

For the charged particle beam drawing apparatus, drawing data is hierarchically divided into a chip level, a frame level, a block level, a cell level and a figure level. In the hierarchically-structured drawing data, a drawing condition (for example, a dose) for a particular figure is adjusted with attribute information (for example, attribute information for defining the dose) given in addition to graphic information on the particular figure. A conventional practice is to give the attribute information to only some of many figures. In recent years, however, a demand for higher resolution has increased the number of cases where attribute information is given to all the figures.

In the above-mentioned attribute giving method, the attribute information is included together with the graphic information in the graphic information file. For this reason, a change to attribute information on a particular figure, for example, requires the regeneration of the entirety of the graphic information file including both the graphic information and the attribute information, and accordingly makes the process efficiency worse. Furthermore, the placing of chips, which are the same in graphic information but different in attribute information, on a mask requires the same graphic information to be generated by duplication, which increases the data volume and worsens the process efficiency. Against these backgrounds, improvement to the process efficiency has been awaited.

DETAILED DESCRIPTION

According to one embodiment, a charged particle beam drawing apparatus includes: a graphic information file for storing graphic information for each of elements at a level underlying an element at a particular level in hierarchically-structured drawing data which has elements at each level; and an attribute information file for storing attribute information to be given to each of the elements at the underlying level in association with information on the element at the particular level.

According to another embodiment, an information processing apparatus includes: a graphic information file for storing graphic information for each of elements at a level underlying an element at a particular level in hierarchically-structured drawing data which has elements at each level; and an attribute information file for storing attribute information to be given to each of the elements at the underlying level in association with information on the element at the particular level.

According to another embodiment, a pattern inspection apparatus includes: a graphic information file for storing graphic information for each of elements at a level underlying an element at a particular level in hierarchically-structured drawing data which has elements at each level; and an attribute information file for storing attribute information to be given to each of the elements at the underlying level in association with information on the element at the particular level.

According to another embodiment, a charged particle beam drawing method includes: generating a graphic information file for storing graphic information for each of elements at a level underlying an element at a particular level in hierarchically-structured drawing data which has elements at each level; and generating an attribute information file for storing attribute information to be given to each of the elements at the underlying level in association with information on the element at the particular level.

Various Embodiments will be described hereinafter with reference to the accompanying drawings.

First Embodiment

Referring to FIGS. 1 to 4, descriptions will be provided for a first embodiment.

Figure 1:
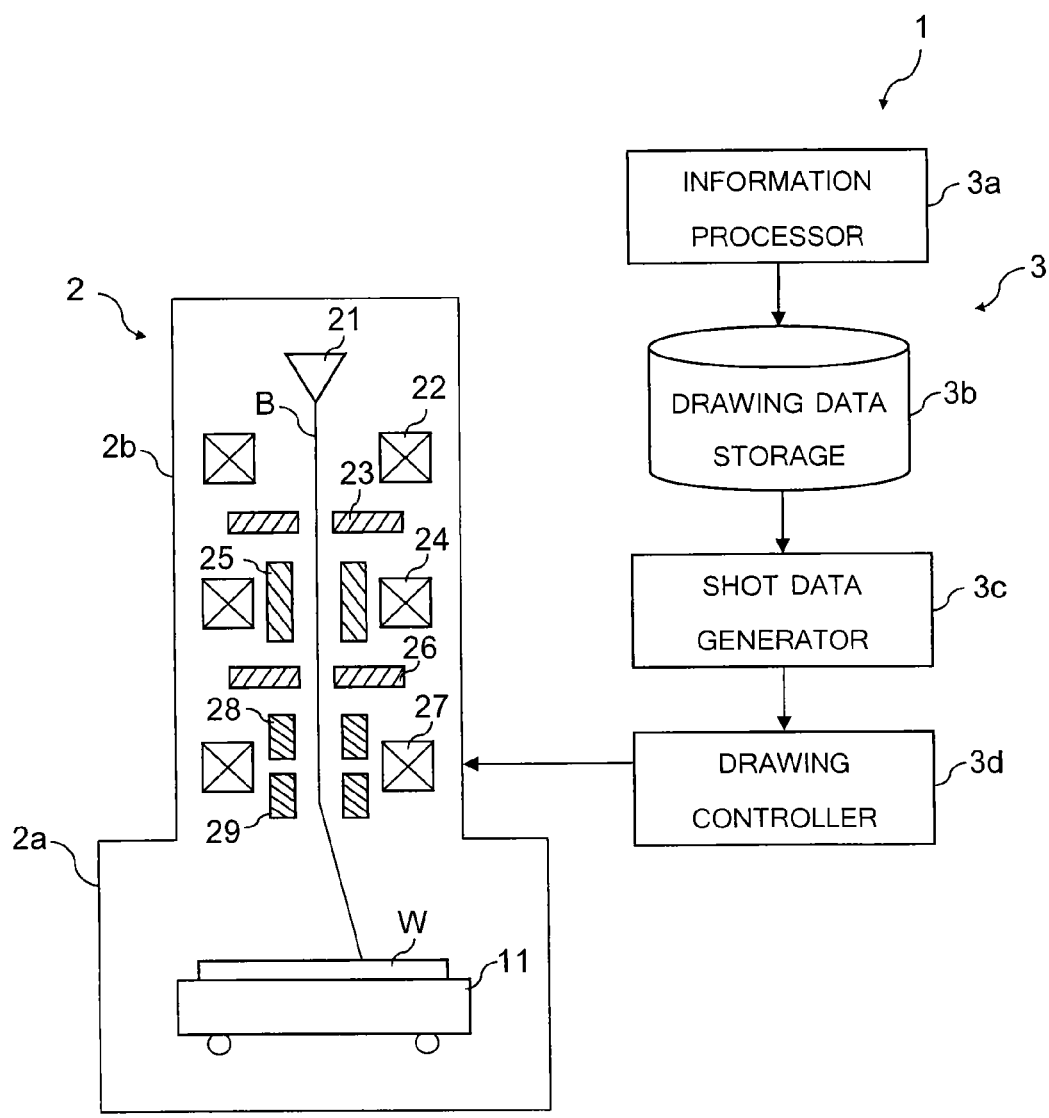
FIG. 1 is a diagram showing a schematic configuration of a charged particle beam drawing apparatus in a first embodiment.

As shown in FIG. 1, a charged particle beam drawing apparatus 1 of the first embodiment includes: a drawing unit 2 for performing drawing by use of a charged particle beam; and a control unit 3 for controlling the drawing unit 2. The charged particle beam drawing apparatus 1 is an example of a shape variable-type drawing apparatus which uses an electron beam, for instance, as the charged particle beam. However, the charged particle beam is not limited to the electron beam, and other charged particle beams such as an ion beam are also applicable.

The drawing unit 2 includes: a drawing chamber (drawing room) 2a to house a workpiece W as a drawing target; and an optical lens barrel 2b continuing to the drawing chamber 2a. The drawing chamber 2a functions as a hermetic vacuum chamber. Meanwhile, the optical lens barrel 2b is provided on an upper face of the drawing chamber 2a, and is configured to shape and deflect the electron beam by using an optical system and to project the electron beam onto the workpiece W in the drawing chamber 2a. In the beam projection, the insides of both the drawing chamber 2a and the optical lens barrel 2b are decompressed and set to a vacuum state.

A stage 11 for supporting the workpiece W such as a mask or a blank is provided inside the drawing chamber 2a. The stage 11 is designed to be movable in an X-axis direction and a Y-axis direction (hereinafter simply referred to as the X direction and the Y direction), which are orthogonal to each other on a horizontal plane. In addition, provided inside the optical lens barrel 2b are: a beam emission unit 21 such as an electron gun for emitting an electron beam B; an illumination lens 22 for collecting the electron beam B; a first shaping aperture 23 for shaping the beam; a projection lens 24 for performing projection; a shaping deflector 25 for shaping the beam; a second shaping aperture 26 for shaping the beam; an objective lens 27 for focusing the beam on the workpiece W; and a secondary deflector 28 and a primary deflector 29 for controlling a beam shot position on the workpiece W.

In the drawing unit 2, the electron beam B is emitted from the beam emission unit 21, and is projected onto the first shaping aperture 23 via the illumination lens 22. The first shaping aperture 23 has a rectangular opening, for example. Accordingly, when the electron beam B passes through the first shaping aperture 23, a cross-sectional shape of the electron beam is shaped into a rectangle, and is projected onto the second shaping aperture 26 via the projection lens 24. It should be noted that: the projection position can be changed by the shaping deflector 25; and the shape and dimensions of the electron beam B can be controlled by changing the projection position. Thereafter, the electron beam B having passed through the second shaping aperture 26 is focused and projected onto the workpiece W on the stage 11 via the objective lens 27. In this projection, a shot position of the electron beam B on the workpiece W on the stage 11 can be changed by the secondary deflector 28 and the primary deflector 29.

The control unit 3 includes: an information processor 3a for generating drawing data by processing information, such as layout data and chip data (design data, CAD data and the like); a drawing data storage 3b for storing the drawing data; a shot data generator 3c for generating shot data by processing the drawing data; and a drawing controller 3d for controlling the drawing unit 2. It should be noted that the information processor 3a, the shot data generator 3c and the drawing controller 3d may be formed from: hardware such as electric circuits; or software such as programs designed to execute the respective functions; otherwise, a combination of the hardware and the software.

The information processor 3a generates the drawing data based on a format for the drawing apparatus by converting data such as the layout data and the chip data (the design data, the CAD data and the like), for example. It should be noted that the layout data and the chip data are those which are created by designers of semiconductor integrated circuits, and are inputted into the information processor 3a from a storage device (not illustrated) such a database archiving the layout data, for example through a wired or wireless network.

The drawing data storage 3b is storage for storing the drawing data based on the format for the drawing apparatus which is generated by the information processor 3a. For example, a magnetic disk device, a semiconductor disk device (a flash memory), and the like can be used as the drawing data storage 3b.

The shot data generator 3c divides a drawing pattern defined by the drawing data into multiple strip regions shaped like a strip (of which a longitudinal direction is the X direction and a short-side direction is the Y direction), and further divides each strip region into many sub-regions in a matrix pattern. In addition, the shot data generator 3c generates shot data by determining the shape, size, position, and the like of a figure in each sub-region. If a figure cannot be drawn in a sub-region by one shot, the shot data generator 3 divides the figure into multiple partial regions each of which can be drawn by one shot. Incidentally, the length in the short-side direction (the Y direction) of each strip region is set equal to a length within which the electron beam B can be deflected by main deflection.

For the purpose of drawing the above-described drawing pattern, the drawing controller 3d draws each figure by: moving the stage 11 in the longitudinal direction (the X direction) of the strip region; locating the electron beam B at each sub-region using the primary deflector 29; and shooting the electron beam B at a predetermined position in the sub-region using the secondary deflector 28. Thereafter, once the drawing on one strip region is completed, the stage 11 is moved stepwise in the Y direction and then the drawing on the next strip region is conducted. The drawing with the electron beam B is conducted in the entire drawing region on the workpiece W by repeating the series of these procedures (an example of a drawing operation). Incidentally, since the stage 11 continuously moves in one direction during the drawing, the primary deflector 29 moves the drawing origin point from one sub-region after another so that the drawing origin point can follow the movement of the stage 11.

As described above, the projection position of the electron beam B is determined while the electron beam B is following the continuously-moving stage 11 by being deflected by the secondary deflector 28 and the primary deflector 29. Thus, drawing time can be reduced by: continuously moving the stage 11 in the X direction; and moving the shot position of the electron beam B along with the movement of the stage 11. Although the stage 11 is continuously moved in the X direction in the first embodiment, the invention is not limited to this. For example, a drawing method called a step-and-repeat method may be instead used which performs the drawing in one sub-region while stopping the stage 11 and suspends drawing when moving the stage 11 to the next sub-region.

Meanwhile, the drawing data usually includes numerous fine patterns (graphic shapes and the like), and is considerably large in data volume. For this reason, in order to make its data volume smaller, the drawing data is compressed by being hierarchically divided. The charged particle beam drawing apparatus 1 uses the hierarchically-structured drawing data.

Figure 2:
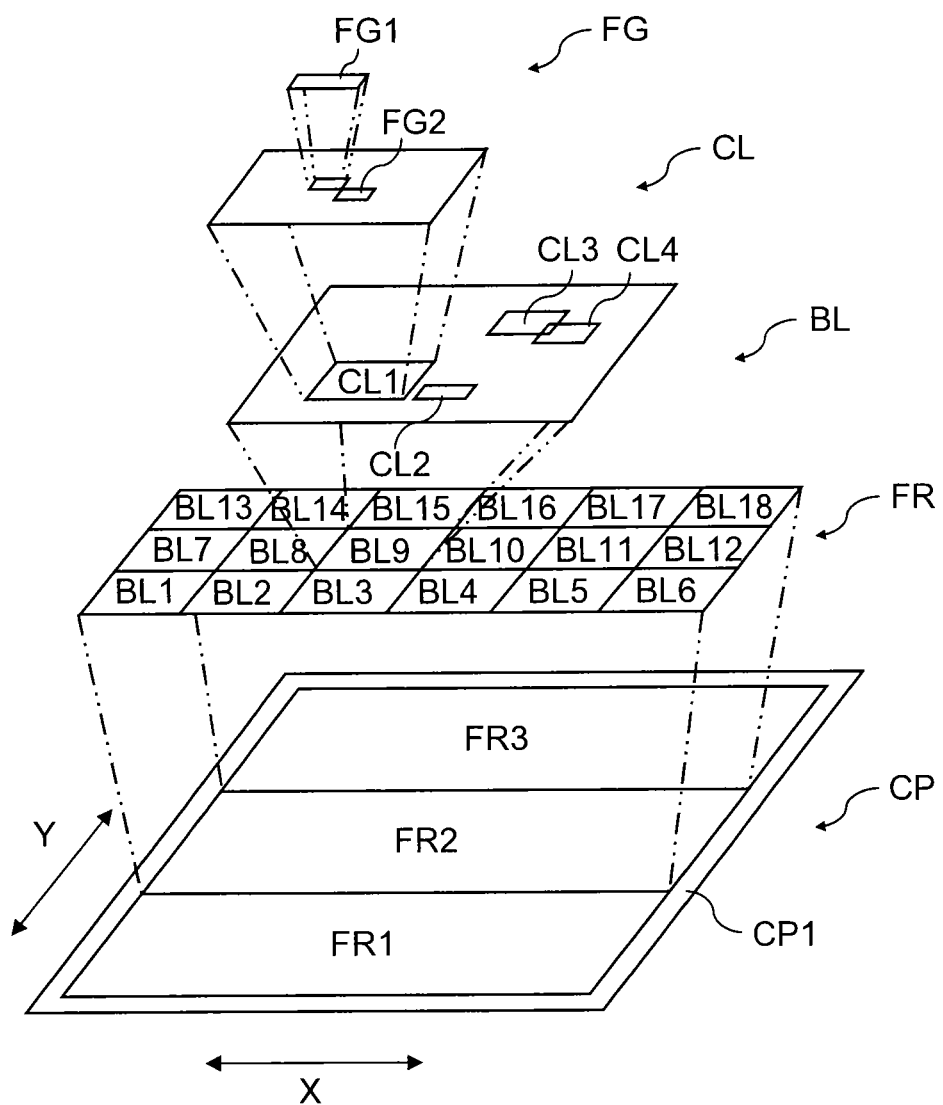
FIG. 2 is an explanatory diagram for explaining drawing data in the first embodiment.

For example, as shown in FIG. 2, the drawing data is hierarchically divided into: a chip level CP; a frame level FR underlying the chip level CP; a block level BL underlying the frame level FR; a cell level CL underlying the block level BL; and a figure level FG underlying the cell level CL (hierarchical structure). Noted that, basically, the drawing data is hierarchically divided regardless of whether or not the format of the drawing data has been converted. In the drawing data like this, if a certain level is considered as a first level, another level underlying the first level is considered as a second level, and yet another level underlying the second level is considered as a third level.

In a case shown in FIG. 2, a chip CP1, which is a part of the element group (chip group) at the chip level CP, corresponds to three frames FR1 to FR3 which are parts of the element group (frame group) at the frame level FR. In addition, the frame FR2, which is a part of the element group at the frame level FR, corresponds to 18 blocks BL1 to BL18 which are parts of the element group (block group) at the block level BL. The block BL9, which is a part of the element group at the block level BL, corresponds to four cells CL1 to CL4 which are parts of the element group (cell group) at the cell level CL. The cell CL1, which is a part of the element group at the cell level CL, corresponds to multiple figures FG1, FG2 which are parts of the element group (figure group) at the figure level FG.

Next, detailed descriptions will be provided for the above-mentioned information processor 3a.

Figure 3:
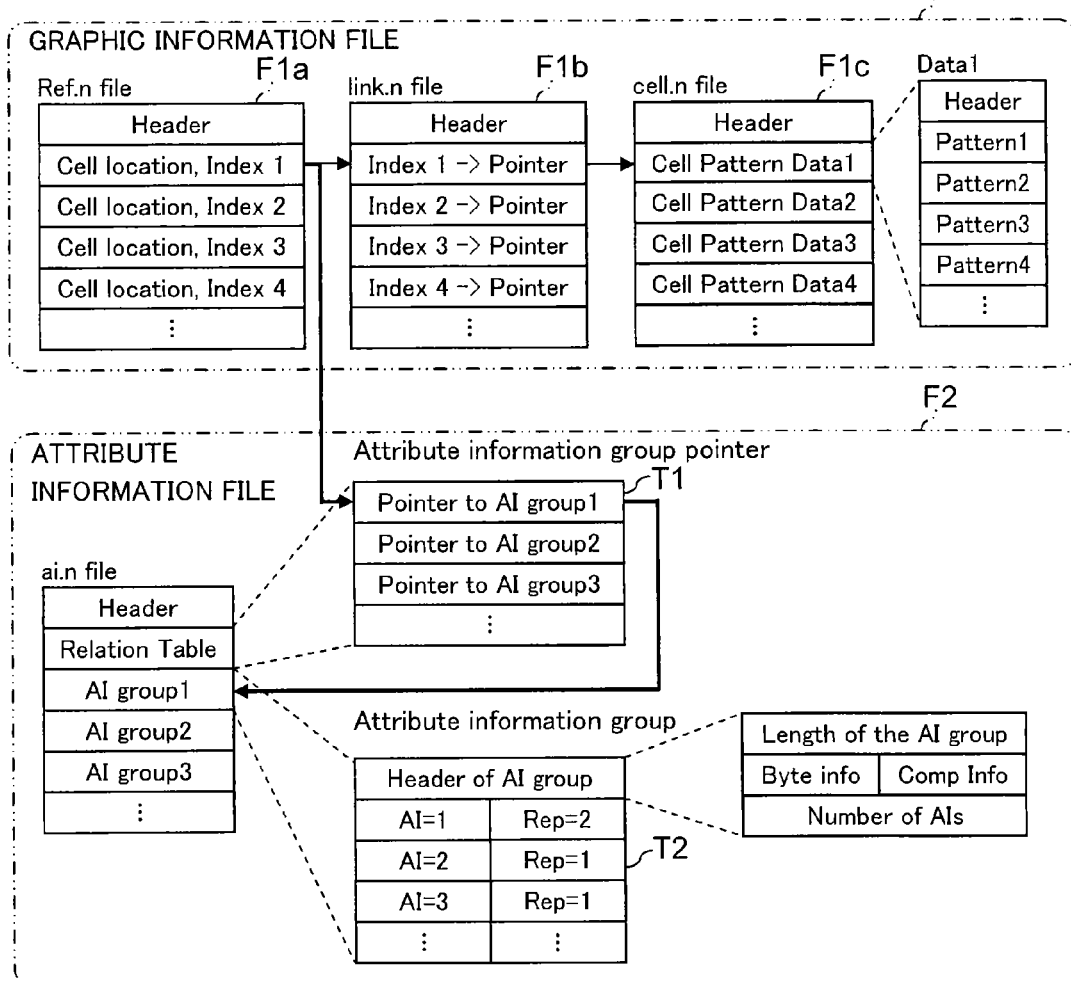
FIG. 3 is an explanatory diagram for explaining a graphic information file and an attribute information file in the first embodiment.

As shown in FIG. 3, the information processor 3a generates a graphic information file F1, and an attribute information file F2 which is separate from the graphic information file F1. The graphic information file F1 is, for example, a frame information file, which is formed from a cell location information file F1a, a link record file F1b and a cell pattern information file (cell figure information file) F1c.

The cell location information file F1a is a file for storing a header (Header), cell location information (Cell locations) and index numbers (Index1, Index2, Index3, Index4, . . . ). An index number (type data number) is set for each piece of cell location information, and functions as index information (identification information) on the piece of cell location information.

The link record file F1b is a file for storing a header (Header) and link record information (Index1→Pointer, Index2→Pointer, . . . ). Each pointer (Pointer) functions as storage location information on a location in which to store information.

The cell pattern information file F1c is a file for storing a header (Header) and multiple pieces of cell pattern information (Cell Pattern Data1, Cell Pattern Data2, . . . ). Each piece of cell pattern information includes multiple pieces of pattern information (Pattern1, Pattern2, . . . ).

The graphic information file F1 like this is a file for storing graphic information for each of the elements at a level underlying an element at a particular level in the hierarchically-structured drawing data which, as described above, has elements at each level. In other words, in FIG. 3, the graphic information file F1 is a file for storing pattern information (figure information) for each of the patterns (figures) at a figure level under each cell at the cell level.

The attribute information file F2 is a file for storing a header (Header), a relation table (Relation Table) T1 and attribute information group tables (AI group1, AI group2, . . . ) T2.

The relation table T1 is a table for defining attribute information group pointers (Pointer to AI group1, Pointer to AI group2, . . . ). This relation table T1 is that for storing the attribute information group pointers, which respectively correspond to the index numbers, in a particular order. Each attribute information group pointer stores a starting address of the group of attribute information (attribute information group) to be given to the patterns in the cell pattern information.

Each attribute information group table T2 is a table for defining a header (Header of AI group) of the corresponding attribute information group, attribute information values (AI), and the number (Rep) of repetitions of the attribute information. This attribute information group table T2 functions as an attribute information table for storing the attribute information corresponding to the group number, and information on the number of repetitions of the attribute information.

The header of the attribute information group is a header for defining the size (Length of the AI group) of the attribute information group, the length (Byte Info) of the field of the attribute information, a flag (Com Info) for indicating whether to perform compression, and the number (Number of AIs) of pieces of the attribute information. It should be noted that when a flag for indicating whether to perform compression is set, the information processor 3a judges that the compression be performed, and compresses the attribute information included in the attribute information group table T2 to a predetermined size in a predetermined format.

The attribute information file F2 like this is a file for storing each element at a level underlying an element at a particular level in association with information on the element at the particular level. In other words, in FIG. 3, the attribute information file F2 is a file for storing attribute information (attribute information on a drawing condition) to be given to each pattern at the figure level corresponding to an cell at the cell level in association with the index number of the corresponding cell location information, which is information on the cell at the cell level.

Meanwhile, an example of the attribute information on the drawing condition is a dose. Apart from the dose, there are a variety of examples of the attribute information, which include the presence or absence of a settling time, and pass attributes (drawing settings for each pass, such as performing drawing during a first pass but no drawing during a second pass, or performing repeated drawing by first and second passes).

Figure 4:
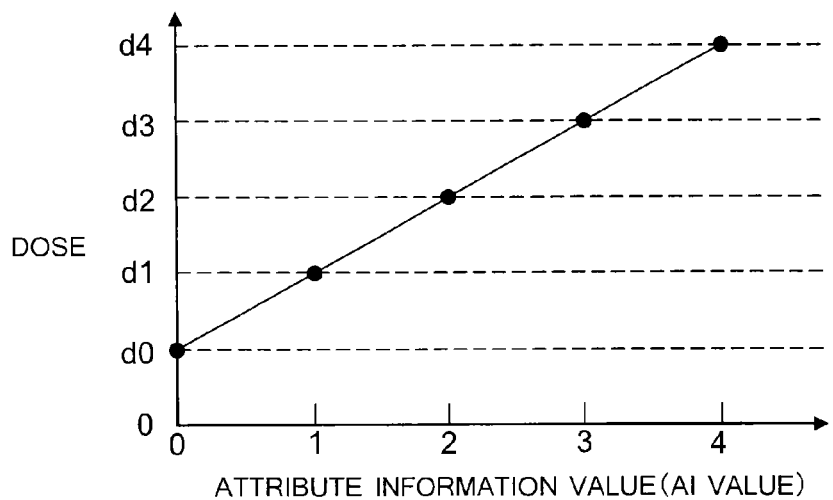
FIG. 4 is a graph showing a relationship between an attribute information value and a dose in the first embodiment.

In this respect, a relationship is determined between the attribute information value (AI value) and the dose, for example, as shown in FIG. 4. When the attribute information value is at 0, the dose is at d0. When the attribute information value is at 1, the dose is at d1. When the attribute information value is at 2, the dose is at d2. When the attribute information value is at 3, the dose is at d3. When the attribute information value is at 4, the dose is at d4. As attribute information on the pattern (figure) of the drawing target, the attribute information value (AI value) is determined from the attribution information file F2. The drawing of the figure of the drawing target is performed on the basis of the attribute information.

In the graphic information file F1 shown in FIG. 3, once the uppermost cell location information "Cell location" is read from the cell location information file F1a, an index number "Index1" of the cell location information is used, and a "Pointer" corresponding to the "Index1" is determined from the link record file F1b; and a cell pattern information "Cell Pattern Data1" corresponding to the "Pointer" is read from the cell pattern information file F1c.

In parallel to this, the above-mentioned "Index1" is used, and an attribute information group pointer "Pointer to AI group1" corresponding to the "Index1" is determined from the relation table T1. This "Pointer to AI group1" points to an attribute information group "AI group1," and an attribute information group table T2 corresponding to the "AI group1" is read. On the basis of the attribute information group table T2, the attribute information is given to each pattern in the cell pattern information "Cell Pattern Data1" in the above-mentioned cell pattern information file F1c.

For example, because AI=1 and Rep=2 in the attribute information group table T2 shown in FIG. 3, the AI value is at 1, and the number of repetitions (the number of repeated uses) of the AI value is at 2. Similarly, because AI=2 and Rep=1, the AI value is at 2, and the number of repetitions of the AI value is at 1. Furthermore, because AI=3 and Rep=1, the AI value is at 3, and the number of repetitions of the AI value is at 1.

On the basis of the attribute information group table T2, first of all, the AI value of 1 is given to the "Pattern1" and "Pattern2" in the "Cell Pattern Data1" in the cell pattern information file F1c (AI=1 and Rep=2). Subsequently, the AI value of 2 is given to the "Pattern3" (AI=2 and Rep=1), and the AI value of 3 is given to the "Pattern4" (AI=3 and Rep=1). Similarly, the AI value is sequentially given to each pattern.

The attribute information file F2 like this is generated by the information processor 3a, separately from the graphic information file F1. As the drawing data, the attribute information file F2, together with the graphic information file F1, is stored in the drawing data storage 3b. For these reasons, a change to the attribute information on a particular figure (pattern), for example, can be achieved by changing or regenerating the attribute information file F2 alone. This makes it possible to make the process efficiency better than by regenerating the entirety of the graphic information file including the graphic information and the attribute information. Furthermore, the placing of chips, which are the same in graphic information but different in attribute information, on the mask can be achieved by: using the same graphic information file F1; and generating attribute information files F2 which are different in attribute information. This makes it possible to make the data volume smaller, and to make the process efficiency better, than by generating two graphic information files each including the graphic information and the attribute information (by generating the same graphic information twice).

Particularly since the same graphic information is not generated twice, the volume of the layout data can be reduced to a large extent. This makes it possible to reduce time needed for drawing data conversion, time needed for data transfer, and time needed from data processing, as well as accordingly to reduce time needed for mask drawing (mainly time needed for data preparation). Moreover, since this data can be easily combined with old data (data including no attribute information, or data including attribute data), the data compatibility can be enhanced.

As described above, the first embodiment generates: the graphic information file F1 for storing the graphic information for each of the elements (for example, patterns) at the level underlying the element (for example, the cell) at the particular level in the hierarchically-structured drawing data having the elements at each level; and the attribute information file F2 for storing the attribute information to be given to each of the elements at the underlying level in association with the information on (for example, the index number of) the element at the particular level. For this reason, the drawing of the figure (pattern) on the basis of the graphic information file F1 can be achieved by: selecting the attribute information from the attribute information file F2 by using the information on the element at the particular level; giving the selected attribute information to the figure; and drawing the figure on the basis of the attribute information and the graphic information.

Accordingly, a change to the attribute information on the particular figure can be achieved by changing or regenerating the attribute information file F2 alone. This makes it possible to make the process efficiency better than by regenerating the entirety of the graphic information file including the graphic information and the attribute information. Furthermore, the placing of chips, which are the same in graphic information but different in attribute information, on the mask can be achieved by using the same graphic information file F1; and generating attribute information files F2 which are different in attribute information. This makes it possible to make the data volume smaller, and to make the process efficiency better, than by generating two graphic information files each including the graphic information and the attribute information.

Second Embodiment

Figure 5:
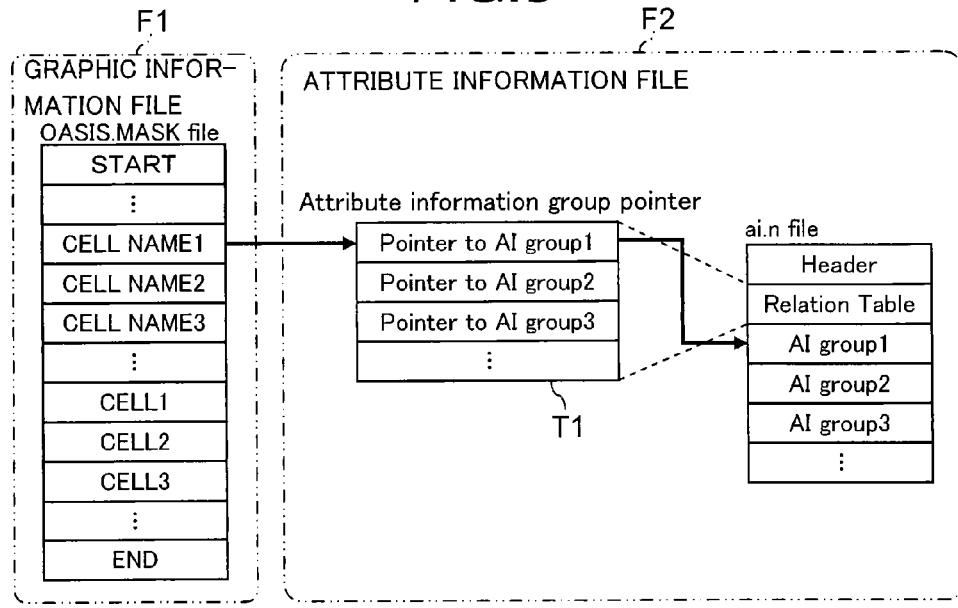
FIG. 5 is an explanatory diagram for explaining a graphic information file and an attribute information file in a second embodiment.

Referring to FIG. 5, descriptions will be provided for a second embodiment.

The second embodiment is basically the same as the first embodiment. Descriptions will be provided for a point (a graphic information file) which makes the second embodiment different from the first embodiment, and descriptions for the rest will be omitted.

As shown in FIG. 5, a graphic information file F1 of the second embodiment is a file in an open standard format (for example, an OASIS format standardized by the SEMI® (standing for Semiconductor Equipment and Materials International, an industry group of semiconductor equipment manufactures). This graphic information file F1 is a file for storing graphic information, namely hierarchically-structured drawing data. The graphic information file F1 stores cell names (CELL NAME1, CELL NAME2, CELL NAME3, . . . ), cell information (CELL1, CELL2, CELL3, . . . ), and the like. In addition, a relation table T1 is a table for storing attribute information group pointers, which correspond to the respective cell names, in a certain order. The others are the same as those in the first embodiment.

Once a cell name "CELL NAME1" is read from the graphic information file F1 shown in FIG. 5, an attribute information group pointer "Pointer to AI group1" corresponding to the "CELL NAME1" is determined from the relation table T2. This "Pointer to AI group1" points to an attribute information group "AI group1." The subsequent process is the same as that in the first embodiment.

In this manner, the attribute information file F2 can be generated to be compatible with the graphic information file F1 in any of various formats including an open standard format. The attribute information file F2 can be provided separately from the graphic information file F1 in any of the various formats. Thereby, the second embodiment can enhance the process efficiency as in the case of the first embodiment.

As described above, the second embodiment can obtain the same effects as the foregoing first embodiment, and can enhance the process efficiency.

Third Embodiment

Figure 6:
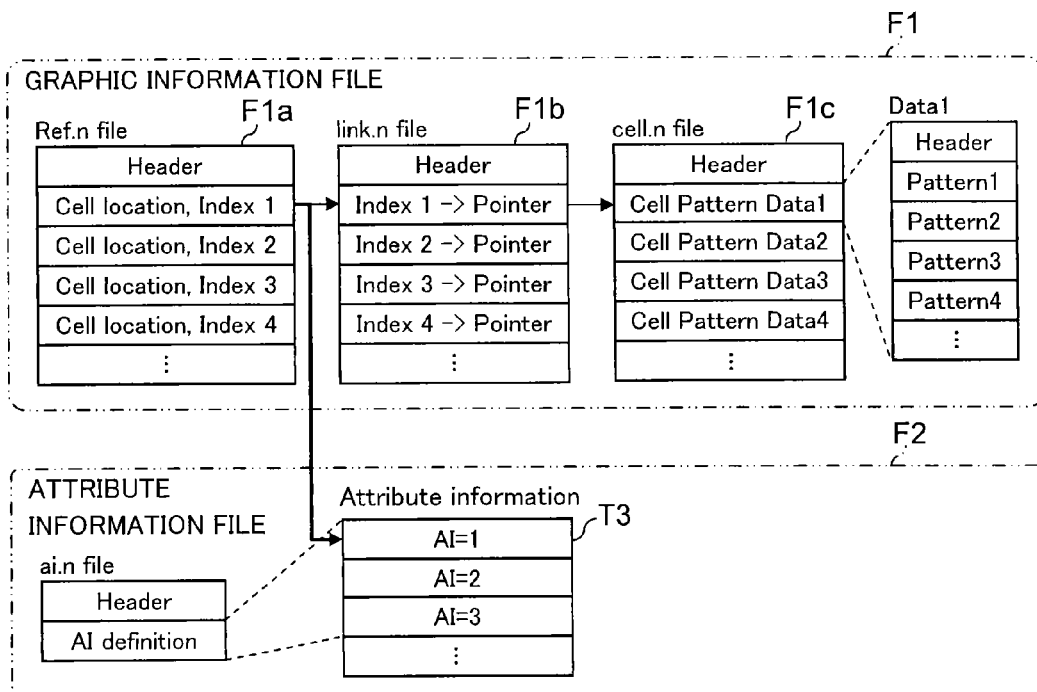
FIG. 6 is an explanatory diagram for explaining a graphic information file and an attribute information file in a third embodiment.

Referring to FIG. 6, descriptions will be provided for a third embodiment.

The third embodiment is basically the same as the first embodiment. Descriptions will be provided for a point (an attribute information file) which makes the third embodiment different from the first embodiment, and descriptions for the rest will be omitted.

As shown in FIG. 6, an attribute information file F2 of the third embodiment does not include the relation table T1 of the first embodiment, but instead includes an attribute information table T3 for storing attribute information corresponding to an index number (a type data number) for each piece of cell pattern information.

In the attribute information table T3 shown in FIG. 6, the AI values are stored sequentially corresponding to the respective index numbers in a way that AI=1, AI=2, AI=3 . . . . In other words, the AI values are stored in a way that: the AI value corresponding to the index number "Index1" is at 1; the AI value corresponding to the index number "Index2" is at 2; and the AI value corresponding to the index number "Index3" is at 3.

On the basis of the attribute information table T3, the AI value of 1 is given to all the patterns (group) in cell pattern information "Cell Pattern Data1" in the cell pattern information file F1c. Furthermore, the AI value of 2 is given to all the patterns in cell pattern information "Cell Pattern Data2," and the AI value of 3 is given to all the patterns in cell pattern information "Cell Pattern Data3." Similarly, the AI value of a common number is given to all the patterns in each piece of cell pattern information.

In this manner, depending on the necessity, the relation table T1 can be eliminated by doing things such as giving the AI value of a common number to all the patterns in the same piece of cell pattern information. Accordingly, the data volume of the attribute information file F2 can be reduced.

As described above, the third embodiment can obtain the same effects as the foregoing first embodiment, and can enhance the process efficiency. Furthermore, the third embodiment can reduce the data volume of the attribute information file F2.

Fourth Embodiment

Figure 7:
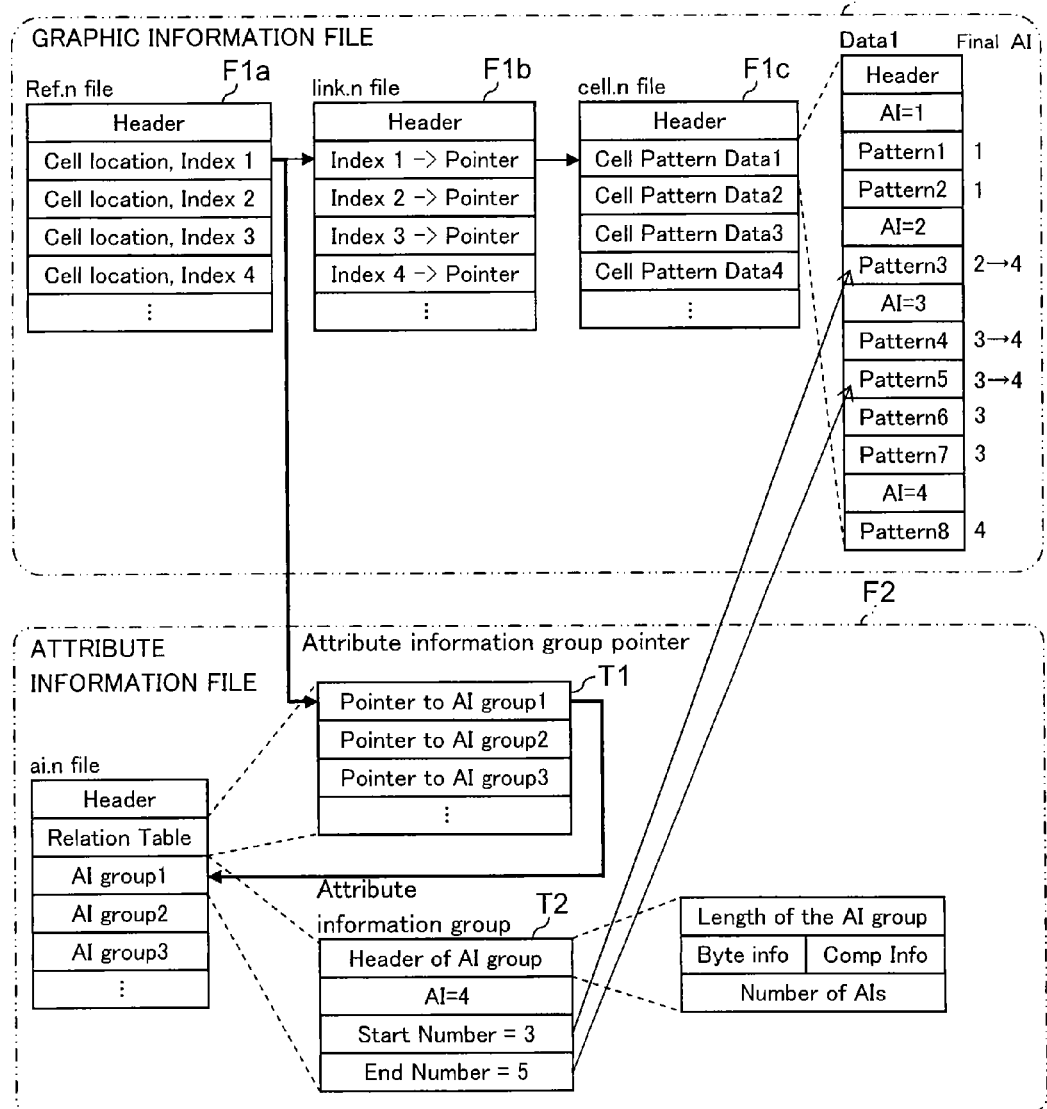
FIG. 7 is an explanatory diagram for explaining a graphic information file and an attribute information file in a fourth embodiment.

Referring to FIG. 7, descriptions will be provided for a fourth embodiment.

The fourth embodiment is basically the same as the first embodiment. Descriptions will be provided for points (a graphic information file and an attribute information file) which make the fourth embodiment different from the first embodiment, and descriptions for the rest will be omitted.

As shown in FIG. 7, a graphic information file F1 of the fourth embodiment is a file which includes the configuration of the first embodiment, and which defines attribute information for each pattern (figure) in cell pattern information. The graphic information file F1 is that which includes the graphic information and the attribute information.

In a cell pattern information file F1c in the graphic information file F1 shown in FIG. 7, the AI values of a "Pattern1" and a "Pattern2" in cell pattern information "Cell Pattern Data1" are at 1. Furthermore, the AI value of a "Pattern3" is at 2; the AI values of a "Pattern4" to a "Pattern7" are at 3; and the AI value of a "Pattern8" is at 4. Similarly, the AI value is sequentially given to each pattern.

An attribute information group table T2 is a table for defining: a header (Header of AI group) of an attribute information group like that of the first embodiment; an attribute information value (AI); and an overwrite start figure number (Start Number) and an overwrite end figure number (End Number) for the attribute information. The overwrite start figure number and the overwrite end figure number function as overwrite information. To this end, the AI value in the attribute information group table T2 is given priority over the AI value in the cell pattern information file F1c.

In the attribute information group table T2 shown in FIG. 7, the AI value of an "AI group1" corresponding to an index number "Index1" is at 4; the overwrite start figure number "Start Number" for the attribute information is at 3; and the overwrite end figure number (End Number) for the attribute information is at 5.

In the "Cell Pattern Data1" in the above-described cell pattern information file F1c, first of all, the AI value of 1 is given to the "Pattern1" and the "Pattern2." Subsequently, the AI value of 2 would be otherwise given to the "Pattern3." Since, however, the "Start Number" in the attribute information group table T2 is at 3, the AI value of 4 in the attribute information group table T2 is given to the "Pattern3" by being written over the foregoing AI value of 2 (2→4). Thereafter, the AI value of 4 is similarly given to the "Pattern4" and the "Pattern5" by overwrite (3→4). Afterward, the AI value of 3 is given to the "Pattern6" and the "Pattern7" without overwrite. Finally, the AI value of 4 is given to the "Pattern8."

In this manner, while the AI value is sequentially given to each pattern, the AI values representing desired patterns in the cell pattern information are forcibly given by overwrite. For this reason, a change to the attribute information can be achieved by changing or regenerating the attribute information file F2 alone without directly processing the graphic information file F1 including the graphic information and the attribute information. This makes it possible to make the process efficiency better than by processing the entirety of the graphic information file including the graphic information and the attribute information.

As described above, the fourth embodiment can obtain the same effects as the foregoing first embodiment, and can enhance the process efficiency.

Fifth Embodiment

Figure 8:
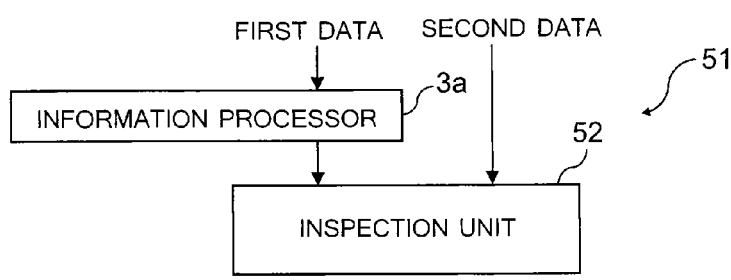
FIG. 8 is a diagram showing a schematic configuration of a pattern inspection apparatus in a fifth embodiment.

Referring to FIG. 8, descriptions will be provided for a fifth embodiment. Descriptions will be provided for a point (a pattern inspection apparatus) which makes the fifth embodiment different from the first embodiment, and descriptions for the rest will be omitted.

As shown in FIG. 8, a pattern inspection apparatus 51 of the fifth embodiment includes: the information processor 3a of any one of the first to fourth embodiments; and an inspection unit 52 for inspecting a pattern. A first data, namely the drawing data generated by the foregoing information processor 3a, is inputted into the inspection unit 52. Meanwhile, a second data, namely drawing data generated on the basis of a pattern actually drawn on the workpiece W by the charged particle beam drawing apparatus 1 of the first embodiment, is inputted into the inspection unit 52.

The first data is inputted into the information processor 3a from a storage device (not illustrated) such a database archiving the data through a wired or wireless network. After processed by the information processor 3a, the first data is inputted into the inspection unit 52. Meanwhile, the second data is inputted into the inspection unit 52 from a storage device (not illustrated) such a database archiving the data through a wired or wireless network. Like the drawing data of the first embodiment, each data is hierarchically divided into the chip level CP, the frame level FR, the block level BL, the cell level CL and the figure level FG (see FIG. 2).

On the basis of each inputted data, the inspection unit 52 inspects things such as the pattern actually drawn on the workpiece W by the charged particle beam drawing apparatus 1 of the first embodiment. The inspection is achieved, for example, by comparing the actually drawn pattern with the drawing data. It should be noted that the inspection needs various pieces of information, such as drawing conditions.

As described above, the fifth embodiment can obtain the same effects as any of the foregoing first to fourth embodiments, and can enhance the process efficiency.

Other Embodiments

Although the foregoing descriptions provided for the first to fifth embodiments are based on the application of the information processor 3a to the charged particle beam drawing apparatus 1 or the pattern inspection apparatus 51, the application is not limited to this. For example, the information processor 3a may be applied to an information processing apparatus (for example, a computer terminal apparatus).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
   a graphic information file to store graphic information for each of elements at a level underlying an element at a particular level in hierarchically-structured drawing data which has elements at each level; and
   an attribute information file to store attribute information to be given to each of the elements at the underlying level in association with information on the element at the particular level which is also located in the attribute information file, the attribute information file being capable of updating independently from the graphic information.

2. The charged particle beam drawing apparatus according to claim 1, wherein
   the graphic information file stores the graphic information and the attribute information for each of the elements at the underlying level, and
   the attribute information file stores overwrite information for writing the attribute information stored in the attribute information file over the attribute information stored in the graphic information file.

3. The charged particle beam drawing apparatus according to claim 1, wherein
   the attribute information file stores number-of-repetitions information for giving the same attribute information to two or more of the elements at the underlying level.

4. The charged particle beam drawing apparatus according to claim 1, wherein
   the attribute information file stores the attribute information which is common among a group of the elements at the underlying level.

5. The charged particle beam drawing apparatus according to claim 1, wherein
   the drawing data is hierarchically divided into a chip level, a frame level underlying the chip level, a block level underlying the frame level, a cell level underlying the block level, and a figure level underlying the cell level,
   the element at the particular level is a cell at the cell level,
   the elements at the underlying level are figures at the figure level, and
   the information on the element at the particular level is layout information on the cell at the cell level.

6. The charged particle beam drawing apparatus according to claim 1, wherein
   the drawing data is hierarchically divided into a chip level, a frame level underlying the chip level, a block level underlying the frame level, a cell level underlying the block level, and a figure level underlying the cell level,
   the element at the particular level is a cell at the cell level,
   the elements at the underlying level are figures at the figure level, and
   the information on the element at the particular level is a name of the cell at the cell level.

7. The charged particle beam drawing apparatus according to claim 1, wherein
   the attribute information is a dose.

8. An information processing apparatus comprising:
   a graphic information file to store graphic information for each of elements at a level underlying an element at a particular level in hierarchically-structured drawing data which has elements at each level; and
   an attribute information file to store attribute information to be given to each of the elements at the underlying level in association with information on the element at the particular level which is also located in the attribute information file, the attribute information file being capable of updating independently from the graphic information.

9. The information processing apparatus according to claim 8, wherein
   the graphic information file stores the graphic information and the attribute information for each of the elements at the underlying level, and
   the attribute information file stores overwrite information for writing the attribute information stored in the attribute information file over the attribute information stored in the graphic information file.

10. The information processing apparatus according to claim 8, wherein
    the attribute information file stores number-of-repetitions information for giving the same attribute information to two or more of the elements at the underlying level.

11. The information processing apparatus according to claim 8, wherein
    the attribute information file stores the attribute information which is common among a group of the elements at the underlying level.

12. The information processing apparatus according to claim 8, wherein
    the drawing data is hierarchically divided into a chip level, a frame level underlying the chip level, a block level underlying the frame level, a cell level underlying the block level, and a figure level underlying the cell level,
    the element at the particular level is a cell at the cell level,
    the elements at the underlying level are figures at the figure level, and
    the information on the element at the particular level is layout information on the cell at the cell level.

13. The information processing apparatus according to claim 8, wherein
the drawing data is hierarchically divided into a chip level, a frame level underlying the chip level, a block level underlying the frame level, a cell level underlying the block level, and a figure level underlying the cell level,
the element at the particular level is a cell at the cell level,
the elements at the underlying level are figures at the figure level, and
the information on the element at the particular level is a name of the cell at the cell level.

14. The information processing apparatus according to claim 8, wherein
the attribute information is a dose.

15. A pattern inspection apparatus comprising:
a graphic information file to store graphic information for each of elements at a level underlying an element at a particular level in hierarchically-structured drawing data which has elements at each level; and
an attribute information file to store attribute information to be given to each of the elements at the underlying level in association with information on the element at the particular level which is also located in the attribute information file, the attribute information file being capable of updating independently from the graphic information.

16. The pattern inspection apparatus according to claim 15, wherein
the graphic information file stores the graphic information and the attribute information for each of the elements at the underlying level, and
the attribute information file stores overwrite information for writing the attribute information stored in the attribute information file over the attribute information stored in the graphic information file.

17. The pattern inspection apparatus according to claim 15, wherein
the attribute information file stores number-of-repetitions information for giving the same attribute information to two or more of the elements at the underlying level.

18. The pattern inspection apparatus according to claim 15, wherein
the attribute information file stores the attribute information which is common among a group of the elements at the underlying level.

19. The pattern inspection apparatus according to claim 15, wherein
the drawing data is hierarchically divided into a chip level, a frame level underlying the chip level, a block level underlying the frame level, a cell level underlying the block level, and a figure level underlying the cell level,
the element at the particular level is a cell at the cell level,
the elements at the underlying level are figures at the figure level, and
the information on the element at the particular level is layout information on the cell at the cell level.

20. The pattern inspection apparatus according to claim 15, wherein
the drawing data is hierarchically divided into a chip level, a frame level underlying the chip level, a block level underlying the frame level, a cell level underlying the block level, and a figure level underlying the cell level,
the element at the particular level is a cell at the cell level,
the elements at the underlying level are figures at the figure level, and
the information on the element at the particular level is a name of the cell at the cell level.

* * * * *